United States Patent
Roeters et al.

(10) Patent No.: US 6,573,461 B2
(45) Date of Patent: Jun. 3, 2003

(54) RETAINING RING INTERCONNECT USED FOR 3-D STACKING

(75) Inventors: Glen E. Roeters, Huntington Beach, CA (US); Frank E. Mantz, Hawthorne, CA (US)

(73) Assignee: DPAC Technologies Corp, Garden Grove, CA (US)

( * ) Notice: Subject to any disclaimer, the term of this patent is extended or adjusted under 35 U.S.C. 154(b) by 0 days.

(21) Appl. No.: 09/957,373

(22) Filed: Sep. 20, 2001

(65) Prior Publication Data

US 2003/0051907 A1 Mar. 20, 2003

(51) Int. Cl.[7] ............................. H01R 12/04; H05K 1/11
(52) U.S. Cl. ....................................... 174/262; 174/261
(58) Field of Search ............................. 174/262, 263, 174/264, 265, 261; 361/767, 768, 771; 439/69, 91; 257/778, 737

(56) References Cited

U.S. PATENT DOCUMENTS

| | | | |
|---|---|---|---|
| 3,316,455 A | 4/1967 | Hucke, III | |
| 3,340,439 A | 9/1967 | Henschen et al. | |
| 3,370,203 A | 2/1968 | Kravitz et al. | |
| 3,437,882 A | 4/1969 | Cayzer | |
| 3,529,213 A | 9/1970 | Farrand et al. | |
| 3,723,977 A | 3/1973 | Schaufele | |
| 3,746,934 A | 7/1973 | Stein | |
| 4,371,912 A | 2/1983 | Guzik | |
| 4,502,098 A | 2/1985 | Brown et al. | |
| 4,638,348 A | 1/1987 | Brown et al. | |
| 4,761,681 A | 8/1988 | Reid | |
| 4,823,233 A | 4/1989 | Brown et al. | |
| 4,833,568 A | 5/1989 | Berhold | |
| 4,841,355 A | 6/1989 | Parks | |
| 4,851,695 A | 7/1989 | Stein | |
| 4,868,712 A | 9/1989 | Woodman | |
| 4,956,694 A | 9/1990 | Eide | |
| 5,016,138 A | 5/1991 | Woodman | |
| 5,128,831 A | 7/1992 | Fox et al. | |
| 5,198,888 A | 3/1993 | Sugano et al. | |
| 5,201,451 A | 4/1993 | Desai et al. | |
| 5,231,304 A | 7/1993 | Solomon | |
| 5,239,447 A | 8/1993 | Cotues et al. | |

(List continued on next page.)

FOREIGN PATENT DOCUMENTS

| | | |
|---|---|---|
| JP | 56-88324 | 7/1981 |
| JP | 59194460 | 11/1984 |
| JP | 60-191518 | 10/1985 |
| JP | 62016535 | 1/1987 |
| JP | 62293749 | 12/1987 |
| JP | 1289190 | 11/1989 |
| JP | 2144986 | 6/1990 |
| JP | 2-239651 | 9/1990 |
| JP | 3255656 | 11/1991 |

OTHER PUBLICATIONS

Kenneth Mason Publications, Ltd. England; "Organic Card Device Carrier"; May 1990; No. 313.

Quadrant Technology, Inc.; "Megabyte per Cubic Inch"; May 1988.

John Wiley & Sons, Inc.; "VLSI Fabrication Principles—Silicon and Gallium Arsenide"; Sorab K. Ghandi, 1994.

Primary Examiner—Albert W. Paladini
Assistant Examiner—Jeremy Norris
(74) Attorney, Agent, or Firm—Stetina Brunda Garred & Brucker

(57) ABSTRACT

A retaining ring interconnect. A retaining ring is formed on a perimeter of a pad on each of two adjoining surfaces of two PCB substrates. A conductive paste is applied between the pads on the two adjoining surfaces. The retaining rings are aligned and facing with each other. By performing a heat compression process, the retaining rings are connected to encompass the conductive paste. A eutectic bond is thus formed to bond the two PCB substrates.

10 Claims, 4 Drawing Sheets

U.S. PATENT DOCUMENTS

| | | | |
|---|---|---|---|
| 5,269,453 A | 12/1993 | Melton et al. |
| 5,282,565 A | 2/1994 | Melton |
| 5,284,796 A | 2/1994 | Nakanishi |
| 5,311,401 A | 5/1994 | Gates et al. |
| 5,313,096 A | 5/1994 | Eide |
| 5,324,569 A | 6/1994 | Nagesh et al. |
| 5,328,087 A | 7/1994 | Nelson et al. |
| 5,329,423 A * | 7/1994 | Scholz |
| 5,343,075 A | 8/1994 | Nishino |
| 5,362,986 A | 11/1994 | Angiulli |
| 5,373,189 A | 12/1994 | Massit et al. |
| 5,375,041 A | 12/1994 | McMahon |
| 5,376,825 A | 12/1994 | Tukamoto et al. |
| 5,384,689 A | 1/1995 | Shen |
| 5,397,916 A | 3/1995 | Normington |
| 5,426,266 A * | 6/1995 | Brown et al. |
| 5,432,678 A | 7/1995 | Russell et al. |
| 5,466,634 A | 11/1995 | Beilstein |
| 5,471,368 A | 11/1995 | Downie et al. |
| 5,481,134 A | 1/1996 | Sobhani et al. |
| 5,514,907 A | 5/1996 | Moshayedi |
| 5,561,593 A | 10/1996 | Rotolante |
| 5,585,162 A * | 12/1996 | Schueller |
| 5,607,538 A | 3/1997 | Cooke |
| 5,612,570 A | 3/1997 | Eide et al. |
| 5,625,221 A | 4/1997 | Kim et al. |
| 5,637,536 A | 6/1997 | Wal |
| 5,677,569 A | 10/1997 | Choi |
| 5,700,715 A | 12/1997 | Pasch |
| 5,759,046 A | 6/1998 | Ingraham et al. |
| 5,776,797 A | 7/1998 | Nicewarner |
| 5,818,106 A | 10/1998 | Kunimatsu |
| 5,818,697 A * | 10/1998 | Armezzani et al. |
| 5,834,843 A | 11/1998 | Mori et al. |
| 5,857,858 A | 1/1999 | Gorowitz et al. |
| 5,867,898 A * | 2/1999 | Laufter et al. |
| 5,869,353 A | 2/1999 | Levy et al. |
| 5,869,896 A | 2/1999 | Baker et al. |
| 5,926,369 A | 7/1999 | Ingraham et al. |
| 5,930,603 A | 7/1999 | Tsuji et al. |
| 5,950,304 A | 9/1999 | Khandros et al. |
| RE36,325 E | 10/1999 | Corbett et al. |
| 5,994,166 A | 11/1999 | Akram et al. |
| 6,014,316 A | 1/2000 | Eide |
| 6,046,909 A * | 4/2000 | Joy |
| 6,057,381 A | 5/2000 | Ma et al. |
| 6,172,874 B1 | 1/2001 | Bartilson |
| 6,188,127 B1 | 2/2001 | Senba et al. |
| 6,222,737 B1 | 4/2001 | Ross |
| 6,262,895 B1 | 7/2001 | Forthun |
| 6,396,156 B1 * | 5/2002 | Tang et al. |

\* cited by examiner

RETAINING RING INTERCONNECT USED FOR 3-D STACKING

BACKGROUND OF THE INVENTION

The present invention relates generally to chip stacks, and more particularly to a 3-D chip stack with a retaining ring interconnect.

As is currently known in the art, packaged components are often stacked using a variety of approaches. In all of the approaches to date, the concept has been for the end user to mount the stacks on the surface of a solid board such as a printed circuit board (PCB). More particularly, one of the most commonly used techniques to increase memory capacity is the stacking of memory devices into a vertical chip stack, sometimes referred to as 3D packaging or Z-Stacking. In the Z-Stacking process, from two to as many as eight memory devices or other integrated circuit (IC) chips are interconnected in a single component (i.e., a chip stack) which is mountable to the "footprint" typically used for a single packaged device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies may also be used in the Z-Stacking process, such use tends to make the stacking process more complex and not well suited to automation.

In the 3-D stacking process, a solder bridge is typically applied to interconnect neighboring layers or PCB substrates that carry IC devices. However, in the ever changing world of electronics, smaller, faster, and more functionality are always requested. Shrinkage of devices generally results in more I/O's in a smaller package. Design rules are requiring shorter signal paths to accommodate the faster die speeds. With the tighter pitches becoming more prominent in the packages, solder bridging between neighboring interconnects becomes more difficult to control. This forces the issue of eliminating solder paste because of its limitation on density. Another concern relates to environmental issues with the lead content in solder and the concern of the disposal. A method to resolve these problems is required.

SUMMARY OF THE INVENTION

The invention provides a retaining ring interconnection to replace the solder joints between neighboring substrates or layers for stacking IC devices, such that the limitation in density and environmental problems caused by lead content attendant to the use of solder paste are eliminated.

A PCB substrate is provided with conductive pads on two opposing surfaces thereof. The two conductive pads are electrically connected with each other by a via through the PCB substrate. A retaining ring is plated on the peripheral portion of at least one of the conductive pads. When the PCB substrate is stacked with the other PCB substrate with the same structure, the retaining rings of two PCB substrates are aligned and faced with each other. A conductive paste is applied between two aligned retaining rings, and an adhesive is applied between two adjoining surfaces of the two PCB substrates. By a lamination process, a eutectic bond is formed of the conductive paste between the retaining rings of two adjoining pads of the two PCB substrates. Meanwhile, the adhesive tightly bonds the two adjoining surfaces of the two PCB boards.

BRIEF DESCRIPTION OF THE DRAWINGS

These, as well as other features of the present invention, will become more apparent upon reference to the drawings wherein:

FIG. 1 is a side view of two substrates stacked together using the retaining ring interconnect provided in the present invent on;

DETAILED DESCRIPTION OF THE INVENTION

Figure 1:
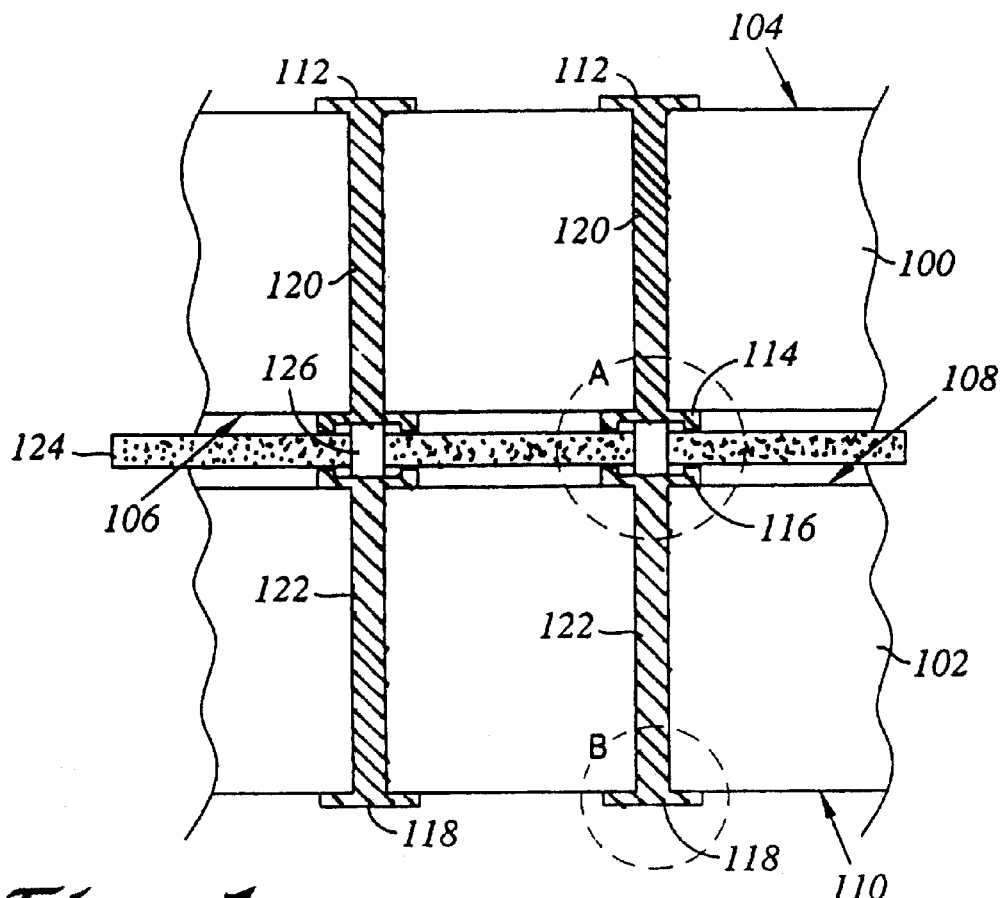

FIG. 1 shows two substrates 100 and 102 to be stacked with each other. The substrate 100 has a top surface 104 and a bottom surface 106, and the substrate 102 has a top surface 108 and a bottom surface 110. Pads 112 and 114 are formed on the top surface 104 and the bottom surface 106, respectively, of the substrate 100. The pads 112 and 114 on two opposing surfaces 104 and 106 of the substrate 100 are electrically connected to each other by the formation of a conductive via 120. Similarly, pads 116 and 118 are formed on the top surface 108 and the bottom surface 110, respectively, of the substrate 106. The pads 116 and 118 on two opposing surfaces 108 and 110 of the substrate 106 are electrically connected to each other by the formation of a conductive via 122 through the substrate 102. The pads 114 and 116 on the surfaces 106 and 108 are processed with plated retaining rings 114*a* and 116*a* (FIG. 2), respectively. Between the pads 114 and 116 and retained within plated rings 114*a* and 116*a* is a conductive ink or conductive paste 126. To facilitate the bonding of the neighboring surfaces 106 and 108 of the substrates 100 and 102, an adhesive 124, preferably a glass resin prepreg, is inserted therebetween. In one embodiment of the invention, the adhesive 124 is applied between adjoining surfaces 106 and 108 of the substrates 100 and 102. Using a lased via technique, the conductive paste 126 is inserted into a via in the lased adhesive 124 in alignment with the retaining rings 114*a* and 116*a*.

Figure 2:
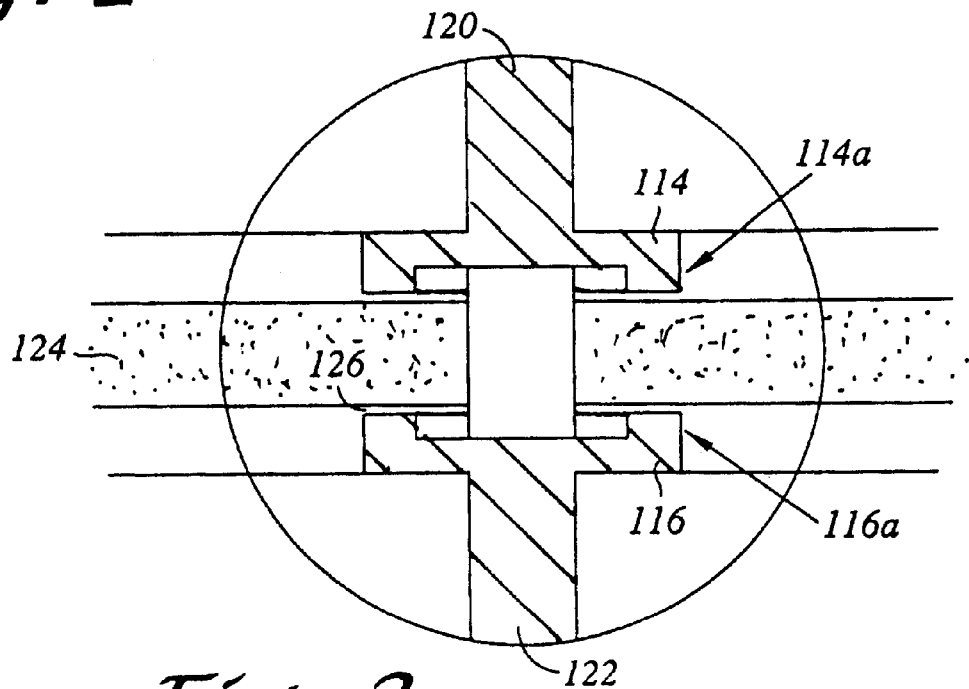
FIG. 2 is an enlarged view of the encircled region A in FIG. 1 showing the retaining ring interconnect be being compressed.

FIG. 2 shows an enlarged side view of the encircled region A as illustrated in FIG. 1. In FIG. 2, plated retaining rings 114*a* and 116*a* are formed on the pads 114 and 116, respectively. Preferably, the plated retaining rings 114*a* and 116*a* are made of the same material, for example, copper, as that of the pads 114 and 116. In one embodiment of the invention, the pads 114 and 116 including the retaining rings 114*a* and 116*a* have a total height of about 0.001 inches. This height may vary in accordance with the dielectric separation needed in the Z-axis. Of the height, about 0.0005 inches is attributable to the retaining ring 114*a*, 116*a*, i.e., the central portion of the pad 114, 116 also has a height or thickness of about 0.0005 inches. That is, the pads 114 and 116 with the retaining rings 114*a* and 116*a* each define a recess having a depth of about 0.0005 inches. The recesses allow the conductive paste 126 to be filled and retained therebetween when the substrates 100 and 102 are compressed against each other. Further in this embodiment, the cross sectional width of the conductive vias 120 and 122 is about 0.004 inches.

Figure 3:
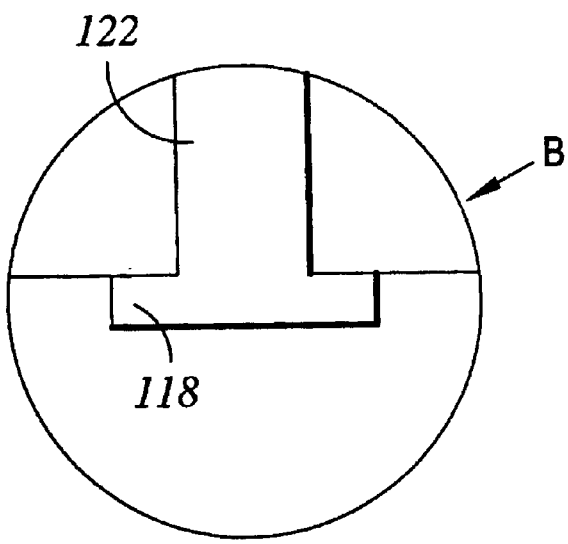
FIG. 3 is an enlarged view of the pad on a distal surface opposed to the adjoining surface of one of the substrates.
Figure 4:
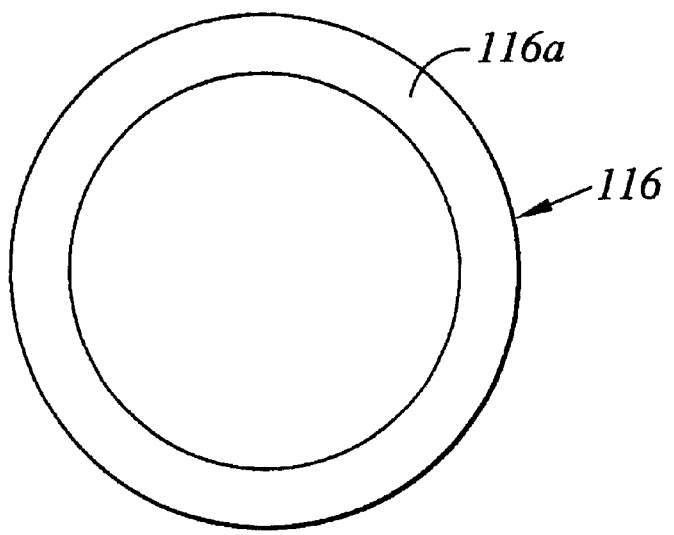
FIG. 4 shows a top view of the plated ring on one of the pads.

Referring to FIG. 3, an enlarged view of the pad 118 on the distal or bottom surface 110 of the substrate 102 is illustrated. The pad 118 has a height or thickness of about 0.0007 inches in this embodiment. Preferably, the pad 112 on the top surface 104 of the substrate 100 has the same dimension of the pad 118. In FIG. 4, a top view of the plated retaining ring 116a is given. The inner and outer diameters of the retaining ring 116a are about 0.006 inches and 0.008 inches, respectively. Preferably, the retaining ring 114a has the same dimension as the retaining ring 116a. The above parameters are preferred when the substrates 100 and 102 each have a thickness of about 0.38 inches. It is appreciated that these parameters are only given as an example of the invention. These parameters may be altered according to specific requirements.

Figure 5:
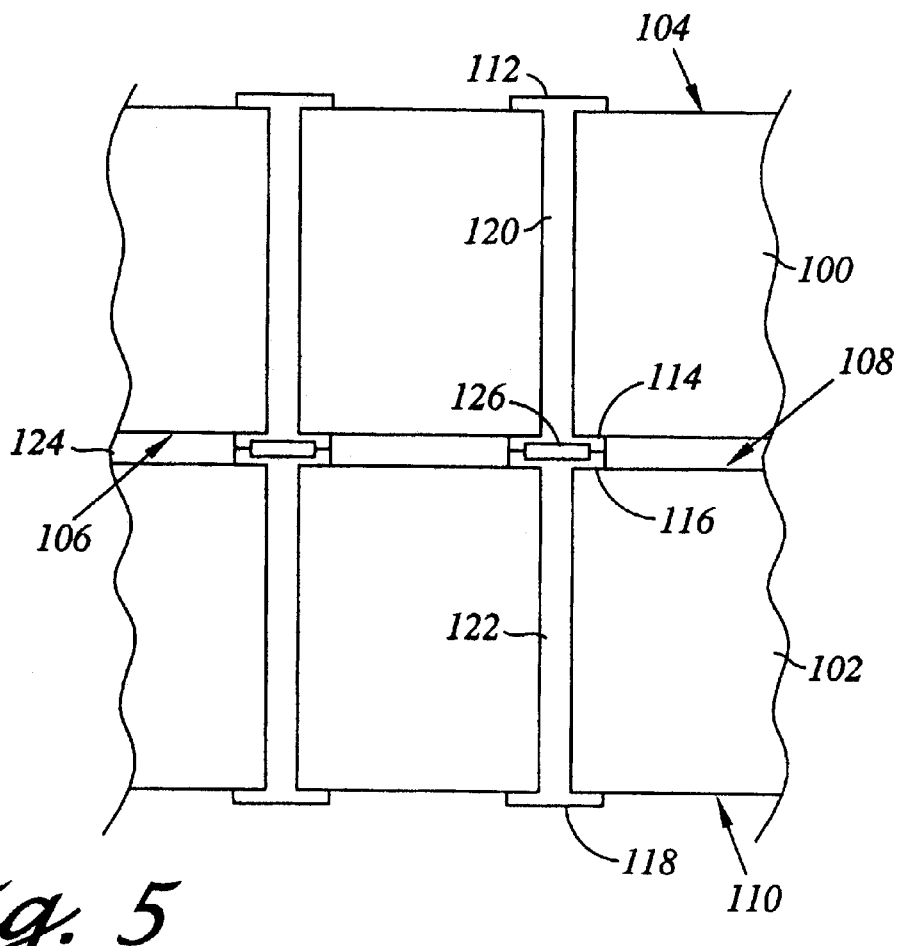
FIG. 5 shows the stacked substrates after compression.

FIG. 5 shows the stacked structure of the substrates 100 and 102 after compression. Referring to FIG. 1, once the retaining rings 114a and 116a of the pads 114 and 116 are aligned with each other and the conductive paste 126 is applied therebetween, a compression step is performed. Tooling pins can be used for the alignment of the retaining rings 114a and 116a. The compression step such as a lamination process controls the pressure and temperature. As a result, a eutectic bond is formed between the pads 114 and 116, while the adhesive 124, preferably a glass resin prepreg, with a thickness equal to the total heights of both the pads 114 and 116 (inclusive of the retaining rings 114a and 116a) reflows to create a tight bond between the substrates 100 and 102. In the above embodiment, as the height of each of the pads 114 and 116 is about 0.001 inches, the thickness of the adhesive 124 is about 0.002 inches. Again, it is appreciated that the thickness of the adhesive 124 may vary from 0.002 inches according to specific requirements.

Figure 6:
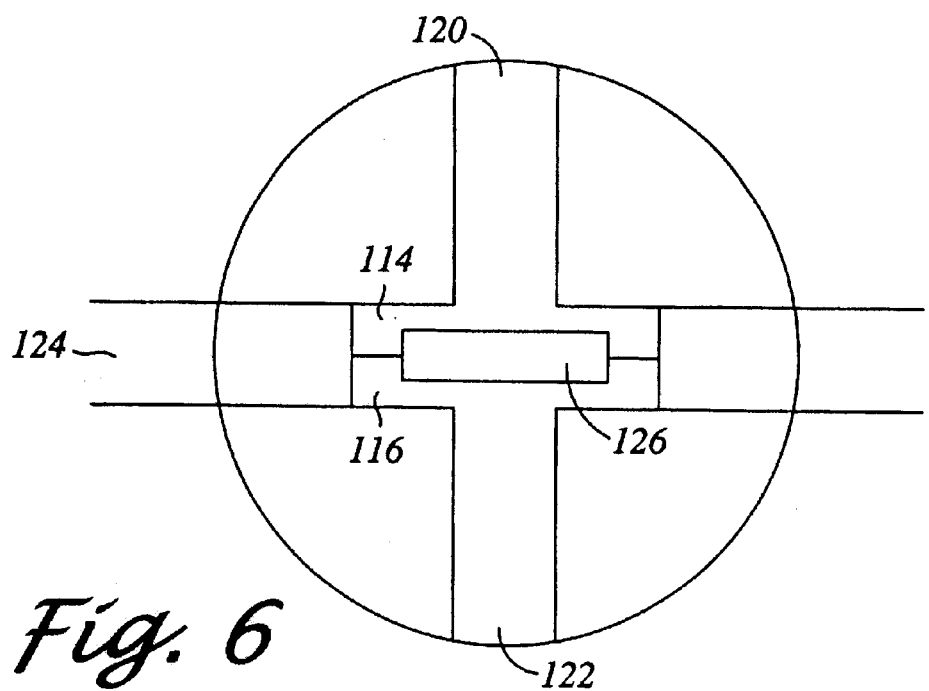
FIG. 6 shows an enlarged view of the encircled region IC in FIG. 5.

FIG. 6 shows an enlarged view of the pads 114 and 116 after compression. After compression, the retaining rings 114a and 116a are aligned and adjoined with each other. Therefore, the conductive paste 126 is encompassed within to form a eutectic bond between the substrates 100 and 102.

The technique of retaining ring interconnect can be applied between layers in a 3-D stacking approach. The retaining ring is used to greatly enhance the assembly process for achieving higher densities. The stacking approach enables the stacking of IC devices, one on top of the other, with vertical as well as horizontal interconnections. Each device or a plurality of devices is attached to a component carrier, also termed as a base. The I/O's of each component carrier are terminated in pads located around the perimeter thereof. A frame comprising matching perimeter pads with retaining rings and feed through holes connecting top and bottom pads is placed between component carrier layers. The bottom component carrier translates the stack to route the I/O's to the appropriate pattern. The layers (component carrier, frame, and the component carrier I/O) are then interconnected using the retaining ring technique.

Figure 7:
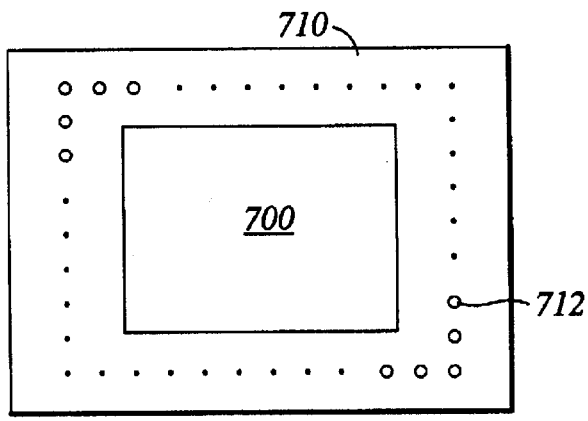
FIG. 7 is a top view of a component carrier, on which an IC device is attached.

FIG. 7 shows an example of the component carrier layer mentioned above. As shown in FIG. 7, an IC device 700 is attached on a component carrier 710. The component carrier 710 has a plurality of perimeter pads 712 formed around the IC device 700. As mentioned above, the I/O's are routed and terminated at the perimeter pads 712.

Figure 8:
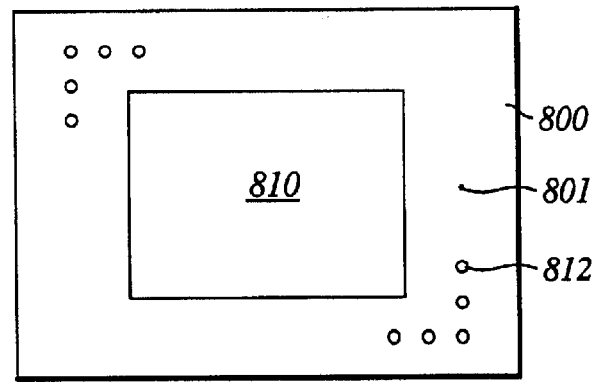
FIG. 8 a top view of a frame to over fit the component carrier as shown in FIG. 7.
Figure 9:
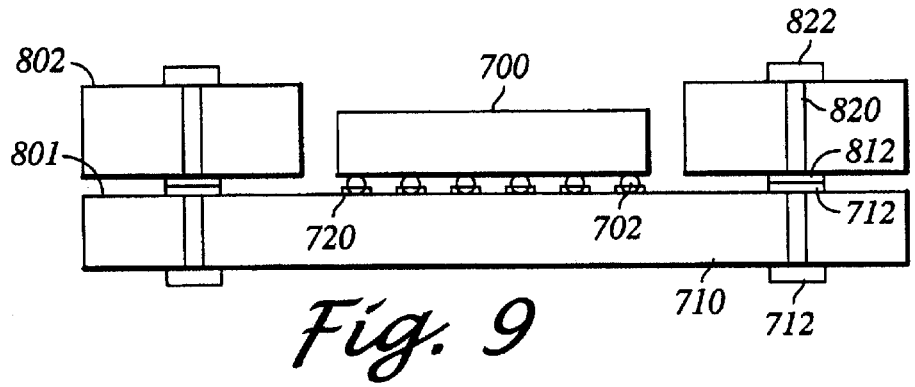
FIG. 9 is a side view of the layer to be stacked with the other, on which a retaining ring is formed.

FIG. 8 shows a frame 800, of which a surface 801 is provided with a plurality of pads 812. Each of the pads 812 on the surface 801 is designed to match a respective one of the perimeter pads 712 on the component carrier 710. On the other surface 802 opposed to the surface 801, a plurality of pads 822 are formed. Each of the pads 822 is electrically connected to a corresponding one of the pads 812 on the surface 801 through a conductive via 820. As shown in FIG. 9, the frame 800 is engageable to the component carrier 710 such that the IC device 700 is accommodated in the opening 810 defined by the frame 800. When a ball grid array (BGA) device is used as the IC device 700, the electrical connections between the IC device 700 and the component carrier 710 are achieved by the ball grid array 702 and a pad array 720. Traces are configured to redirect the pad array 720 to the perimeter pads 712.

The IC device 700 carried by the component carrier 710 may include a BGA device, a TSOP (thin, small outline package) device, a flip chip device, a chip scale package (CSP), a microBGA ($\mu$BGA) device, or even a bare die. Alternatively, more than one of the above IC devices may be intermixed on the component carrier 700. When the frame 800 overfits the component carrier 710, the pads 812 and 712 are aligned and electrically connected to each other. Preferably, the retaining ring structure is applied on the pads 812 and 712 instead of using conventional solder. Further, retaining rings may also be applied on the pads 822 and 722 on distal surfaces of the frame 800 and the component carrier 710 for further connection or stacking.

Further, when panels, for example, the typical 4"×6" panels with multiple stack sites, are processed and stacked in a stacking fixture and cured with heat and pressure such as provided by a vacuum lamination press, the retaining rings can be applied. During the lamination cycle, the conductive paste forms a eutectic bond between the retaining rings. At this time the adhesive also reflows to create a tight bond from layer to layer. Once cured, the conductive paste will not reflow at temperature above 350° C.

The retaining ring interconnect replacing the solder bridge makes a finer pitch more possible and practical. A lower process temperature is required compared to the conventional solder process, therefore, less potential damage is caused to the IC components. Using the conductive paste for the eutectic bond, there is no post assembly cleaning required. Further, as it can be easily produced in panel format, producibility is increased.

Indeed, each of the features and embodiments described herein can be used by itself, or in combination with one or more of other features and embodiments. Thus, the invention is not limited by the illustrated embodiment but is to be defined by the following claims when read in the broadest reasonable manner to preserve the validity of the claims.

What is claimed is:

1. A retaining ring interconnect, comprising:

two pads disposed on two adjoining surfaces of two stacked substrates, each of the two pads including a peripheral retaining ring, the two retaining rings being aligned with and directly connected to each other; and a conductive paste disposed between the two pads and contained by the two retaining rings thereof.

2. The retaining ring interconnect according to claim 1, further comprising an adhesive layer bonding the two adjoining surfaces of the two substrates to each other.

3. The retaining ring interconnect according to claim 2, wherein the adhesive layer has a thickness of about 0.002 inches.

4. The retaining ring interconnect according to claim 1, wherein each of the two substrates has a distal surface including a pad formed thereon and electrically connected to the pad on the surface adjoining the other substrate by a conductive via.

5. The retaining ring interconnect according to claim 4, wherein each pad formed on the distal surface has a height of about 0.0007 inches.

6. The retaining ring interconnect according to claim 1, wherein each of the two pads including the retaining ring has a total height of about 0.001 inches.

7. The retaining ring interconnect according to claim 6, wherein each of the retaining rings of the two pads has a height of about 0.0005 inches.

8. The retaining ring interconnect according to claim 1, wherein each of the retaining rings has an inner diameter of about 0.0006 inches and an outer diameter of about 0.0008 inches.

9. The retaining ring interconnect according to claim 1, wherein the retaining rings are formed of copper.

10. A retaining ring interconnect, comprising:
   two pads disposed on two adjoining surfaces of two stacked substrates, each of the two pads including a peripheral retaining ring, the two retaining rings being aligned with and connected to each other;
   a conductive paste disposed between the two pads and contained by the two retaining rings thereof; and
   an adhesive layer including a glass resin prepreg bonding the two adjoining surfaces.

\* \* \* \* \*